(12) United States Patent
Dolhagaray et al.

(10) Patent No.: US 8,398,412 B2
(45) Date of Patent: Mar. 19, 2013

(54) HOUSING, ELECTRICAL COUPLING INCLUDING SAID HOUSING, AND VEHICLE INCLUDING SUCH A COUPLING

(75) Inventors: Jean-Claude Dolhagaray, Saclay (FR); Francis Roy, Les Ulis (FR); Daniel Chatroux, Teche (FR); Roger Milly, Satolas et Bonce (FR); Jimmy Roure, Villeurbanne (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/256,785

(22) PCT Filed: Mar. 15, 2010

(86) PCT No.: PCT/EP2010/053309
§ 371 (c)(1),
(2), (4) Date: Dec. 2, 2011

(87) PCT Pub. No.: WO2010/106027
PCT Pub. Date: Sep. 23, 2010

(65) Prior Publication Data
US 2012/0071041 A1    Mar. 22, 2012

(30) Foreign Application Priority Data
Mar. 16, 2009  (FR) ..................................... 09 01214

(51) Int. Cl.
*H01R 12/00*   (2006.01)
(52) U.S. Cl. ..................................... 439/76.1
(58) Field of Classification Search ............... 439/34, 439/67, 66, 76.1–76.2, 620.01
See application file for complete search history.

(56) References Cited

U.S. PATENT DOCUMENTS

| | | | |
|---|---|---|---|
| 3,836,943 A * | 9/1974 | Horak | 439/394 |
| 3,951,490 A * | 4/1976 | Devendorf | 439/63 |
| 3,989,333 A * | 11/1976 | Cauldwell | 439/76.1 |
| 4,851,609 A * | 7/1989 | Reddy | 174/371 |
| 6,359,331 B1 | 3/2002 | Rinehart et al. | |
| 7,347,696 B2 * | 3/2008 | Yamamoto | 439/34 |
| 7,775,578 B2 * | 8/2010 | McDermott | 296/65.03 |
| 7,814,637 B2 * | 10/2010 | Terada | 29/434 |
| 2002/0126465 A1 | 9/2002 | Maly et al. | |
| 2010/0109397 A1 * | 5/2010 | Bandurksi et al. | 297/216.12 |
| 2010/0285679 A1 * | 11/2010 | Miller et al. | 439/139 |
| 2012/0009804 A1 * | 1/2012 | Heichal et al. | 439/34 |

FOREIGN PATENT DOCUMENTS

| | | |
|---|---|---|
| EP | 1 777 772 | 11/2007 |
| FR | 2 606 226 | 5/1988 |
| WO | WO 2006/120901 | 11/2006 |

* cited by examiner

*Primary Examiner* — Neil Abrams
*Assistant Examiner* — Phuongchi Nguyen
(74) *Attorney, Agent, or Firm* — Occhiuti Rohlicek & Tsao LLP

(57) ABSTRACT

The invention relates to a housing, including: electronic components (42); walls (44) mechanically insulating said electronic components from the outside; at least one electric connection pad (18, 20, 22, 24) arranged on an outer surface of one of said walls so as to be electrically coupled to a cable outside the housing, said connection pad being electrically coupled to the electronic components (42) inside the housing, characterized in that the connection pad includes: a printed circuit board (50) defining a portion of the housing wall (44) and having a surface exposed to the outside of the housing; and an electric connection outer plane (60, 62) engraved on said surface for directly contacting the outer cable, said plane being electrically coupled to the electronic components.

9 Claims, 3 Drawing Sheets

Figure 1:
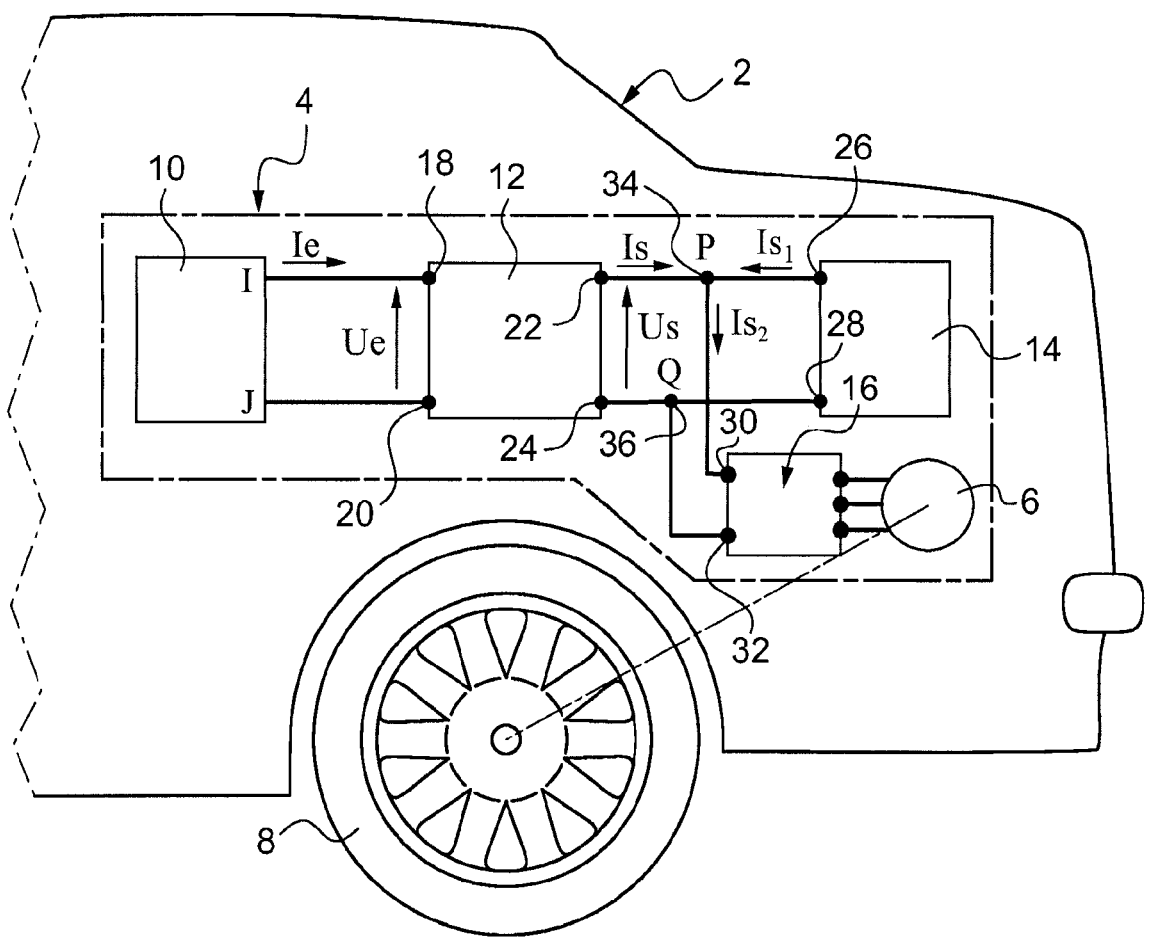

HOUSING, ELECTRICAL COUPLING INCLUDING SAID HOUSING, AND VEHICLE INCLUDING SUCH A COUPLING

CROSS REFERENCE TO RELATED APPLICATIONS

This application is the national stage entry under 35 USC 371 for PCT/EP2010/053309, filed on Mar. 15, 2010, which claims the benefit of the Mar. 16, 2009 priority date of French application no. 0901214. The contents of both the foregoing applications are incorporated herein by reference.

The invention pertains to a housing, an electrical coupling made by means of this housing and a vehicle equipped with this electrical coupling.

Prior art housings comprise:
electronic components,
walls that mechanically isolate electronic components from the exterior,
at least one electrical connection pad placed on an external face of one of these walls to be electrically coupled to one or more cables or another type of electrical link (bar, plate, etc) external to the housing, this connection pad being electrically coupled to the electronic components placed inside the housing.

In the prior-art housings, this connection pad can take various forms:
for example, the form of a pin of a connector. A same connector may, as needed, combine several connection pads insulated from one another. This method requires a two-part connector, one part integrally joined to the face of the wall of the housing and one moving part fixedly joined to the cable external to the housing. This principle has the advantage of giving a high degree of facility and reliability in connection/disconnection operations. However, it has the drawback of being very bulky and very costly, especially for high-current applications (involving currents of over about 10 amperes),
for example, in the form of a screw, a nut and a metal base, generally made of brass or copper, enabling electrical current to pass through the wall of the housing.

The metal base goes from one side of the wall to the other while being designed to be electrically insulated from it. Within the housing, it is electrically coupled to an electrical conductor which electrically couples this screw to the electronic components. The screw projects out of the box perpendicularly to the external face. It is mechanically fixed to the metal base. It is generally made of a metal (electrically conductive) which is electrically connected to the metal base and also insulated from the wall of the housing.

On its external face, the metal base has a supporting surface perpendicular to the axis of the screw.

The cable situated outside the housing ends in a lug capable of being hooked to the screw of the housing and of taking support on this supporting surface. The nut then enables the lug to be fixed to the screw and to set up electrical contact between the lug and the metal base and therefore with the electronic components in the housing.

The contact surface between the lug and the supporting surface must be great to limit the electrical resistance at the interface between these two elements. This often take the form of a bulky connection system which projects well beyond the external face of the housing.

Besides, electrical contact with the screw is set up by means of the nut, the screw and their threads. There is therefore also this passageway for the current. The wiring resistance depends on the coupling torque, the surface states of the screw and nut and the state of corrosion. The electrical contact is therefore poorly reproducible and therefore a source of breakdown or malfunction which can deteriorate over time.

The invention seeks to overcome at least one of these drawbacks by proposing an improved housing.

An object of the invention therefore is a housing in which the connection pad comprises:
a printed circuit board forming a part of the wall of the housing, and having one face exposed to the exterior of the housing, and
at least one external electrical connection plane etched on the face of the printed circuit board exposed to the exterior of the housing, to be put into direct contact with the external cable, this plane being electrically coupled to the electronic components internal to the housing.

In the above housing, the external plane (for example the power supply connection) is an electrical contact surface of the connection pad with the electrical cable without any increase in the overall space requirement of the connection system in a direction perpendicular to the external face. This therefore enables the making of a connection pad whose total space requirement in a direction perpendicular to the external face of the housing is limited.

Furthermore, the connection system thus made is particularly simple and costs little.

The embodiments of this housing may comprise one or more of the following characteristics:
the connection pad comprises:
a ground plane etched on the printed circuit board, and
at least one common mode filtering capacitor coupled between the electrical connection plane and this ground plane;
the capacitor is a surface-mounted capacitor;
the connection pad comprises:
an internal electrical connection plane etched on an internal surface of the printed circuit board exposed to the interior of the housing, and
several conductive cross-pieces fixedly joined on one side to the external electrical connection plane and on the other side to the internal electrical connection plane in order to provide them with permanent electrical coupling;
the power supply planes have a width of at least 1 cm for a length of at least 1 cm;
the connection pad includes a mechanism for the removable attachment of the external cable to the external electrical connection plane.

These embodiments of the housing furthermore have the following advantages:
positioning a capacitor between the power supply plane and a ground plane etched on the same printed circuit board limits the unwanted inductances in the wiring of this capacitor, thus ultimately making it possible to improve the common mode electromagnetic filtering;
using a surface-mounted capacitor further decreases the unwanted wiring inductance values and therefore further improves the common mode electromagnetic filtering in order to contribute to the efficient behavior of the housing in the field of electromagnetic compatibility (EMC);
using several conductive cross-pieces coupling the external and internal planes provides for a passage of current that is reproducible and reliable in time and depends little on any tightening force;
using a plane whose surface areas are greater than 1 cm$^2$ gives low-impedance high-frequency links towards the common mode filtering capacitor or capacitors;

using a removable attachment mechanism enables the reversible mounting and dismounting of the external cable.

An object of the invention is also an electrical coupling comprising:
at least one cable that ends in a lug with an electrical contact face,
the above housing whose external plane is directly supported on the contact face of the lug.

The embodiments of this coupling may comprise the following characteristics:
the coupling has two external cables designed to be electrical connected to the same connection pad, each external cable ending in a lug having an electrical contact face, and
the surface of the external electrical connection plane of this connection pad is extended enough for the contact faces of the lugs of these two external cables to be directly and simultaneously supported beside one another on this external electrical connection plane.

This embodiment of the electrical connection furthermore has the following advantage:
the arrangement of the lugs of the external cables beside one another decreases the thickness of the connection system in the direction perpendicular to the external face of the printed circuit board.

An object of the invention is also a vehicle equipped with the above electrical coupling.

Figure 2:
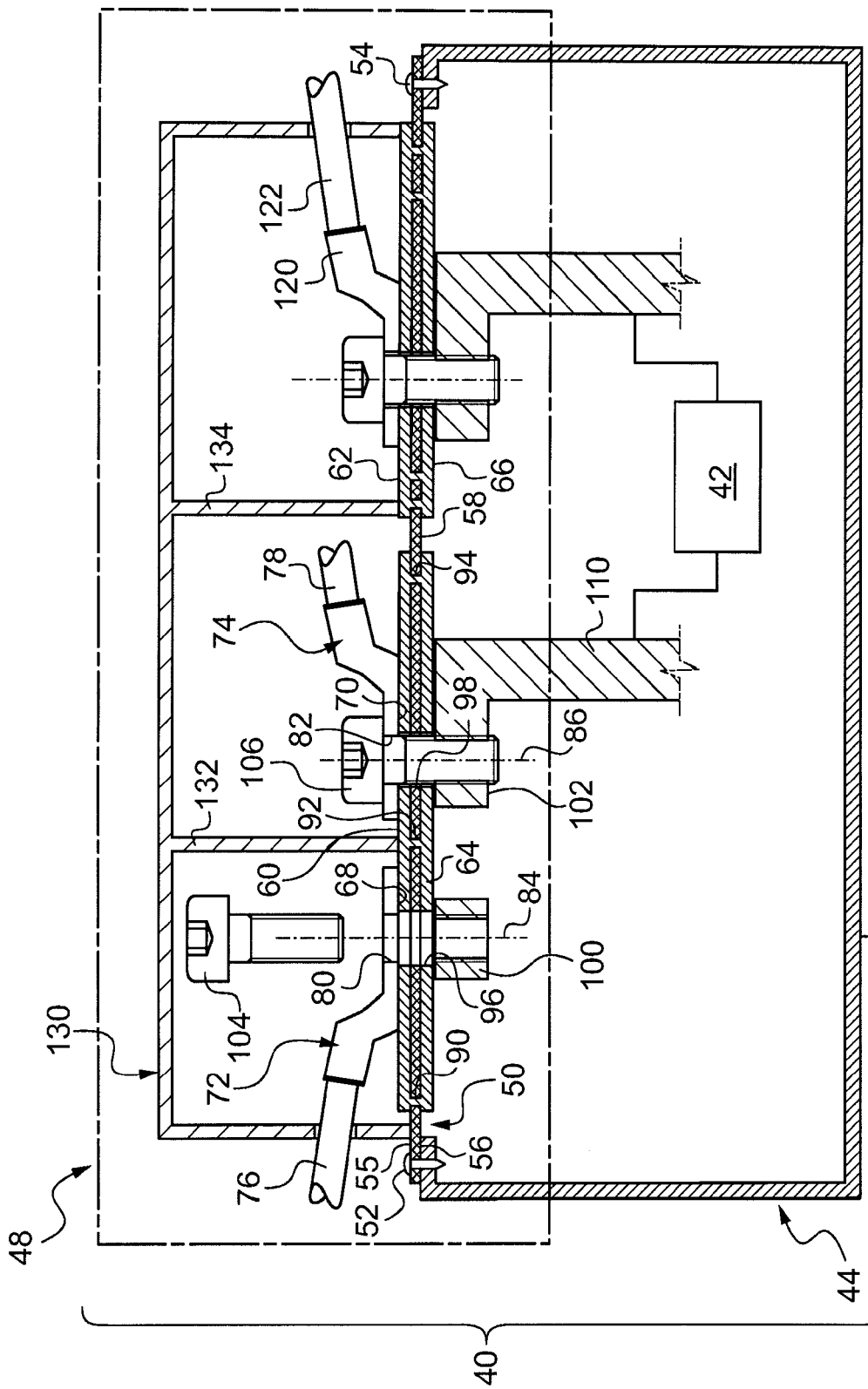
Figure 3:
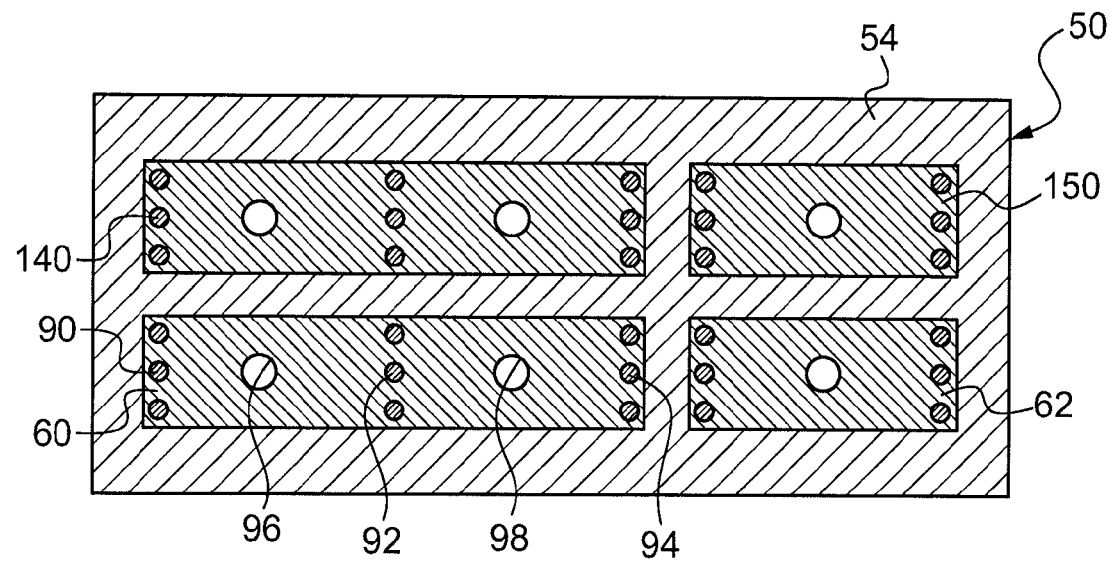
Figure 4:
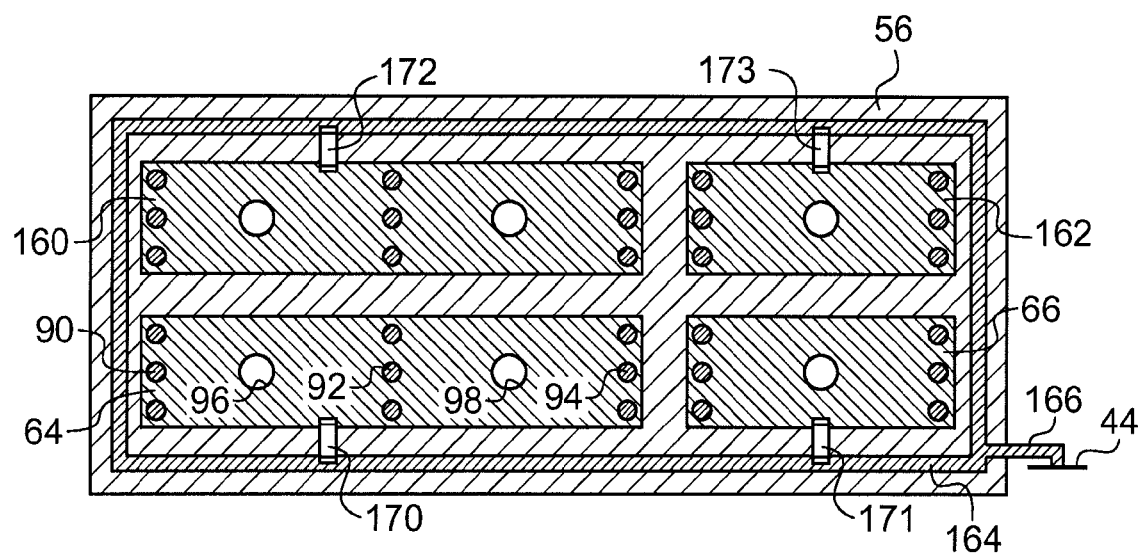

The invention will be understood more clearly from the following description, given purely by way of a non-exhaustive example, and made with reference to the drawings of which:

FIG. 1 is a schematic illustration of a vehicle equipped with an electronic power housing, FIG. 2 is a schematic illustration in cross-section of the connection system of the electronic housing of FIG. 1, FIGS. 3 and 4 are illustrations in a top view and a bottom view of a printed circuit board used in the connection system of FIG. 2.

In these figures, the same references are used to designate the same elements.

Here below in this description, the characteristics and functions well known to those skilled in the art shall not be described in detail.

FIG. 1 shows a vehicle 2 such as an automobile vehicle. This vehicle 2 is equipped with a power supply system 4 for supplying power to an electrical motor 6 capable of rotationally driving the drive wheels of the vehicle 2. To simplify FIG. 1, only one drive wheel 8 has been shown.

The system 4 comprises:
a power cell 10 with fuel capable of generating a current of intensity $I_e$ at a voltage called Ue,
a DC/DC convertor 12 whose connection pads 18, 20 are directly coupled electrically to the power cell 10,
an electrochemical battery 14 whose connection pads 26, 28 are directly connected to connection pads 22, 24 of the convertor 12, and
an inverter 16 whose connection pads 30, 32 are also directly connected electrically to the pads 22, 24 of the convertor 12.

Here below, unless otherwise indicated, when it is stated that two elements are coupled to each other, it means that there is an electrical coupling.

Furthermore, when it is stated that these two elements are "directly" connected to each other, it means that the electrical connection has been made without going through other electrical loads. Typically, this corresponds to a direct electrical link made by means of electrical conductors whose line resistance is far below 1Ω/m when a DC current passes through them.

Here, a cable or a conductor is called "a power" cable or conductor if it is capable of conveying an electrical power current without getting deteriorated. An electrical power current is a current whose intensity is preferably greater than 25 A or 100 A.

The pads 22 and 24 are also connected to the pads 30 and 32 by means of electrical shunt lines 34 and 36.

The inverter 16 generates a three-phase current and voltage for powering the motor 6 from a DC voltage Us.

The convertor 12 generates the voltage Us from the voltage Ue delivered by the cell 10.

The inverter 16 is therefore powered by the voltage Us dictated by the battery 14 and by the currents delivered by the current convertor 12 and by the battery 14.

The convertor 12 takes the form of a housing 40 shown in greater detail in FIG. 2.

All the electronic power components needed to convert the voltage Us and the current Ie into a voltage Us and a current Is are housed within the housing 40. To simplify the illustration, these electronic power components are shown in the form of a block 42.

The external contours of the housing 40 are demarcated by walls 44. The walls 44 completely surround the components 42 to mechanically insulate them from the exterior. Here, these walls 44 are made out of a conductive material connected to ground. They therefore form a Faraday cage which prevent the propagation of the electromagnetic waves generated by the switching over of the components 42 outside the housing 40.

The walls 44 are equipped with a connection system 48. The connection system 48 comprises connection pads 18, 20, 22 and 24.

To simplify FIG. 2, only the connection system corresponding to the pads 18, 22 is shown in detail. The connection system used to make the connection pads 20 and 24 is similar to the one described in detail for the pads 18, 22.

One of the walls 44 has an aperture filled by a printed circuit board 50. The board 50 therefore forms a part of this wall and participates in the mechanical insulation of the external components 42. The board 50 is fixed without any degree of freedom to the rim of the aperture. For example, it is fixed to the wall 44 by means of screws 52, 54.

The board 50 has an external face 55 pointed towards the exterior of the housing and an internal face 56 facing the interior of the housing. External and internal electrical connection planes are etched respectively on the external and internal faces 55 and 56. Typically, these power supply planes are made of copper. These planes are conductive tracks whose width and length are greater than 1 cm and preferably greater than 2 cm. Here, each external plane is of the same dimension as an internal plane positioned so as to be facing it but on the other side of the board 50. These external and internal planes are separated by a plate 58 made of electrically insulating material.

By way of an illustration, two external planes 60 and 62 and the two corresponding internal planes 64 and 66 are shown in FIG. 2. The planes 60 and 64 belong to the connection pad 22. The planes 62 and 66 belong to the connection pad 18.

The plane 60 is placed directly and simultaneously in contact with two faces 68, 70 respectively, of lugs 72, 74. The lugs 72 and 74 form the distal parts respectively of power cables 76, 78. The cable 76 couples the pad 22 to the pad 26 of the battery 14. The cable 78 couples the pad 22 to the pad 30 of the inverter 16.

For example, the lugs 72 and 74 are lugs crimped onto the end of the cables 76 and 78. The lugs are made out of a conductive material such as copper.

Each lug 72, 74 has a via hole, 80, 82 respectively extending along an axis, 84, 86 respectively perpendicular to the faces 68 and 70. These holes 80 and 82 are designed to receive attachment screws.

The lugs 72 and 74 are positioned side by side so that their respective faces 68 and 70 are directly and simultaneously supported on the plane 60. The faces 68 and 70 have a surface area that is great enough to enable the passage of the electrical power current without causing any deterioration of these lugs 72 and 74. For example, to this end, the faces 68 and 70 each have a length of more than 1 cm by a width of more than 1 cm.

The length and the width of the plane 60 are sufficient to receive, side by side, the lugs 72 and 74. The length and the width of the plane 60 are both chosen to define a surface area greater than the total of the surface areas of the faces 68, 70.

The plane 60 is coupled to a plane 64 by means of cross-pieces or via made out of electrically conductive material. Three cross-pieces 90, 92 and 94 are shown in FIG. 2. Each cross-piece 90, 92 and 94 extends perpendicularly to the faces 54 and 56. These cross-pieces are extended from the plane 60 up to the plane 64. These cross-pieces 90, 92 and 94 provide for a passage of electrical current that is reproducible and reliable in time between the electronic components 42 and the plane 60 on which the lugs 72 and 74 rest. In particular, the passage of current through the cross-pieces does not depend on a tightening force or a surface condition.

For example, these cross-pieces are metalized holes. The number of these cross-pieces as well as the cross-section of each of these cross-pieces are chosen as a function of the intensity of the power current that must pass from the plane 60 to the plane 64. More specifically, the number and section of the cross-pieces are chosen to limit the heating.

The board 50 is also equipped with a mechanism for the removable attachment of the lugs 72 and 74 to the plane 60. To this end, via holes 96, 98 are made through the board 50. These via holes 96 and 98 extend respectively along the axes 84 and 86. They cross the thickness of the board 50 from one side to the other. A nut 100 is soldered to the plane 64 around the opening of the hole 96. Similarly, a nut 102 is soldered to the plane 64 around the opening of the hole 98. These nuts 100 and 102 are designed to receive screws, 104 and 106 respectively. In their assembled position, the screws 104 and 106 respectively go through the holes 80, 96 and 82, 98 to placed the faces 68 and 70 of the lugs 72 and 74 against the plane 60. In FIG. 2, only the screw 106 is shown in its assembled position. Conversely, the screw 104 is shown in a disassembled position. In the disassembled position, the screw 104 has not yet been introduced through the holes 80 and 96 or screwed into the nut 100.

The screws and the nuts are herein made out of an electrically conductive material such as copper or steel. Thus, the electrical power current brought or distributed by the external cables flow from the plane 60 to the plane 64 by means of the cross-pieces 90, 92 and 94 as well as by means of the screws 104, 106 and the nuts 100 and 102.

Furthermore, here the bolt 102 is also soldered to an electrical conductor 110 which connects the plane 64 to the components 42.

The pad 22 thus made also fulfils the function of the shunt 34. Indeed, since the lugs 72 and 74 are simultaneously put into contact with this plane 60, these lugs are connected to each other by means of this plane. This means that the use of a shunt mechanically independent of the housing 40 is avoided.

The plane 62 is put into direct electrical contact with a lug 120 forming the distal end of a power cable 122 coupled to the cell 10. The pad 18 used to couple the cable 122 to the components 42 is identical to the pad 22 except that the plane 62 and 66 are not designed to receive two lugs side by side. This pad is therefore not described herein in detail.

The connection system 48 also has a cap 130 for protecting the connection pads and the lugs coupled to these pads. Here, this cap 130 has internal partition walls 132 and 134 designed to electrically insulate the lugs of each of the power cables from one another. These partition walls prevent the appearance of a short-circuit between two lugs should one of the lugs be poorly attached to the board 50. To this end, the design of the cap 130 and of the partitions is such that it enables this insulation function. For example, they can be made out of an electrically insulating material. They can also be made out of a metal material for purposes of improving the EMC behavior of the system but in this case the function of insulation between the lugs and between the lugs and the cap is provided for example by a cap which is lined internally by an insulating layer or else by sizing the cap to make it big enough and robust enough to ensure this insulation in every case. The cap 130 is fixed to the board 50 or to the wall 44 by any appropriate means.

FIG. 3 shows the external face 54 of the board 50.

In this figure, in addition to the planes 60 and 62 which have already been described, planes 140 and 150 can be seen. For example, the plane 140 is used to make the pad 24. The plane 150 is used to make the pad 20. These pads 20 and 24 are similar respectively to the pads 18 and 22 and are therefore not described in detail herein.

Outside these planes 60, 62, 140 and 150, the external face of the board 50 is formed solely by the insulator material 58.

In this FIG. 3, the circles such as the circles 90, 92 and 94 symbolize the position of the different cross-pieces which connect the external planes to the internal planes.

FIG. 4 shows the internal face 56 of the board 50. In this figure, in addition to the planes 64 and 66, planes 160 and 162 can be seen. These planes 160 and 162 are used to make respectively the pads 22 and 18. These planes have the same sizes and are placed so as to be facing planes visible on the face 54.

The planes 106 and 162 fulfill the same functions as the planes 64 and 66 and are not described in greater detail herein.

Unlike the face 54, the face 56 comprises, in addition to the planes 64, 66, 160 and 162, a ground plane 164 coupled to the walls 44 by means of a connection 166. This plane 164 is electrically insulated from the planes 64, 66, 160 and 162 by means of a strip of insulating material 58. This plane 164 passes in proximity to each of the planes 64, 66, 160 and 162 while at the same time maintaining, relatively to these planes, an insulation distance capable of preventing the appearance of a direct short-circuit between one of these planes 64, 66, 160 and 162 and the plane 164.

Common-mode filtering capacitors 170 to 173 are soldered between the planes 64, 66, 160 and 162 and the plane 164 so as to enable the filtering out of the electromagnetic disturbances of a frequency greater than or equal to 10 MHz. More specifically, the capacitors 170 to 173 are soldered between on the one hand the plane 164 and on the other hand the planes 64, 66, 160 and 162 respectively.

These capacitors 170 to 173 are surface-mounted components (SMCs) and are therefore provided with metalized ends directly soldered to the corresponding conductive planes. The positioning of these capacitors 170 to 173 as described herein improves the efficiency of the common mode electromagnetic filtering. Indeed, the capacitors are positioned very close to the connections between the external cables and the ground plane by a minimum of wiring, thus reducing the parasitic inductances caused by these wiring systems.

More specifically, the planes 64, 66, 160 and 162 have a very great surface area, i.e. their respective lengths and widths are both greater than 1 cm. This enables a high frequency, low-impedance link towards the capacitors 170 to 173. Thus, the overall unwanted inductance obtained between each of the planes 64, 66, 160 and 162 and the plane 164 is less than 10 nH. Thus, up to frequencies greater than 10 MHz, the common mode disturbing currents are shunted by these decoupling capacitors towards the walls 44 of the housing 40, which acts as a Faraday cage.

This is a major advantage as compared with the classic prior-art solutions which consist in soldering one or more capacitors between the screw and the walls 44 of the housing. This prior-art solution is limited by the unwanted inductance of the connection attachments which is in the range of 10 nH per centimeter of attachment. It can be observed classically that, from 10 MHz, the capacitor is no longer capable of accurately shunting the parasitic currents towards the walls 44, which act as a Faraday cage, because of the unwanted impedance of the linking lugs.

Numerous other embodiments are possible. For example, the board 50 can be replaced by a printed circuit board comprising more than two layers in which tracks are etched. Such a board has at least one external plane in direct contact with the lugs and at least one internal plane in direct contact with electrical conductors situated within the housing 40. Furthermore, this board has one or more intermediate layers housed in between the external and internal planes. Conductive tracks are etched in these intermediate layers which enable the flexible coupling of the external and internal planes.

Conversely, the board 50 can be replaced by a printed circuit board that has only one layer in which all the tracks made out of conductive material are etched, including the power supply planes. In this embodiment, the internal power supply plane is omitted. Preferably, a ground plane such as the plane 140 is etched in this single layer and the capacitors such as the capacitors 170 to 173 are soldered as described with regard to FIG. 4 to filter the common-mode electromagnetic disturbances.

The lugs of the external cables can be fixed to the external planes without resorting to nuts and bolts. For example, the lugs of the power cables are directly soldered to the external planes.

The external cables can be used to bring the power supply voltage or any other desired potential. Generally, there are as many external electrical connection planes as there are different potentials in all the connections to be coupled.

It is not necessary for the common mode filtering capacitors to be surface-mounted. They can also be capacitors equipped with attachments designed to be soldered by conventional soldering.

The protection cap can also be made by means of a heat-shrinkable sheath placed on the entire upper face 54 so as to mould each of the lugs as well as the upper face which remains free. The protection cap can also be made by molding of an insulator material on the power supply planes and the lugs of the upper face 54.

The housing 40 can be equipped with several printed circuit boards positioned on different faces of this housing.

The electrical conductor which, within the housing 40, connects each pad to the components 42 is a power cable or a set of bars capable of conveying the electrical power current into the housing.

As a variant, the ground plane is electrically independent of the walls 44 of the housing 40.

As a variant, the housing has only electronic components which are not electronic power components.

The housing described can also be applied to the connection of external cables adapted solely to conveying low-intensity currents.

The above description applies to any housing comprising electronic components insulated from the exterior by this housing and designed to be coupled to external cables. Thus, it is not necessary for this housing to be used in an automobile vehicle. Nor is it necessary for the housing to be the housing of a DC/DC convertor. For example, it may be a housing of an inverter. Nor is it necessary that this housing should be implemented in a configuration such as the one described with reference to FIG. 1.

The invention claimed is:

1. An apparatus comprising:
   electronic components,
   a housing for said electronic components, said housing including walls that mechanically isolate electronic components from the exterior of said housing,
   at least one electrical connection pad arranged on an external face of one of the walls to be electrically coupled to a cable external to the housing, the connection pad being electrically coupled to the electronic components placed inside the housing,
   wherein the connection pad includes:
      a printed circuit board forming a part of the wall of the housing, and having one face exposed to the exterior of the housing, and
      at least one external electrical connection plane etched on the face to be put into direct contact with the external cable, the connection plane being electrically coupled to the electronic components.

2. The apparatus of claim 1, wherein the connection pad comprises:
   an internal electrical connection plane etched on an internal surface of the printed circuit board exposed to the interior of the housing, and
   several conductive cross-pieces fixedly joined on one side to the external electrical connection plane and on the other side to the internal electrical connection plane in order to provide them with permanent electrical coupling.

3. The apparatus of claim 1, wherein the electrical connection planes have a width of at least 1 cm for a length of at least 1 cm.

4. The apparatus of claim 1, wherein the connection pad includes a mechanism for the removable attachment of the external cable to the external electrical connection plane.

5. The apparatus of claim 1, wherein the connection pad comprises:
   a ground plane etched on the printed circuit board, and at least one common mode filtering capacitor coupled between the electrical connection plane and the ground plane.

6. The apparatus of claim 5, wherein the capacitor is a surface-mounted capacitor.

7. The apparatus of claim 1, further comprising an electrical coupling, said electrical coupling including at least one external cable that ends in a lug having an electrical contact face, and wherein said external electrical connection plain is directly supported on the contact face of the lug.

8. The apparatus of claim 7, wherein:
the coupling comprises two external cables that are to be electrically connected to the same connection pad, each external cable ending in a lug having an electrical contact face, and
the surface of the external electrical connection plane of the connection pad is extensive enough for the contact faces of the lugs of the two external cables to be directly and simultaneously supported beside one another on the external electrical connection plane.

9. A vehicle comprising
an electrical coupling, said electrical coupling having at least one external cable that ends in a lug having an electrical contact face,
electronic components;
a housing for said electronic components, said housing having walls that mechanically isolate electronic components from the exterior,
at least one electrical connection pad arranged on an external face of one of the walls to be electrically coupled to a cable external to the housing, the connection pad being electrically coupled to the electronic components placed inside the housing, wherein the connection pad includes:
a printed circuit board forming a part of the wall of the housing, and having one face exposed to the exterior of the housing, and
at least one external electrical connection plane etched on the face to be put into direct contact with the external cable, the connection plane being electrically coupled to the electronic components, said external electrical connection plane being directly supported on the contact face of the lug.

* * * * *